(12) United States Patent
Jefferies et al.

(10) Patent No.: US 10,539,596 B2
(45) Date of Patent: Jan. 21, 2020

(54) CURRENT SENSOR ERROR COMPENSATION METHOD

(71) Applicant: SCHNEIDER ELECTRIC USA, INC.

(72) Inventors: Kevin M. Jefferies, Raleigh, NC (US); Benjamin W. Edwards, Rolesville, NC (US); Matthew L. White, Cary, NC (US); Alan E. Freeman, Raleigh, NC (US)

(73) Assignee: Schneider Electric USA, Inc., Andover, MA (US)

( * ) Notice: Subject to any disclaimer, the term of this patent is extended or adjusted under 35 U.S.C. 154(b) by 85 days.

(21) Appl. No.: 15/850,988

(22) Filed: Dec. 21, 2017

(65) Prior Publication Data

US 2019/0195922 A1 Jun. 27, 2019

(51) Int. Cl.
*G01R 19/25* (2006.01)
*G01R 23/02* (2006.01)

(52) U.S. Cl.
CPC ..... *G01R 19/2506* (2013.01); *G01R 19/2513* (2013.01); *G01R 23/02* (2013.01)

(58) Field of Classification Search
CPC . G01R 19/2506; G01R 19/2513; G01R 23/02
USPC ............ 324/600, 677–681, 709–713, 76.11, 324/76.41, 76.79–76.83
See application file for complete search history.

(56) References Cited

U.S. PATENT DOCUMENTS

| | | | |
|---|---|---|---|
| 5,832,414 A * | 11/1998 | Hart | G01R 19/2513 702/77 |
| 8,589,096 B2 | 11/2013 | Kim et al. | |
| 9,372,240 B2 | 6/2016 | Tamura | |
| 2004/0056661 A1* | 3/2004 | Maeda | G01R 1/203 324/332 |
| 2015/0015241 A1 | 1/2015 | Tamura | |

\* cited by examiner

*Primary Examiner* — Melissa J Koval
*Assistant Examiner* — Trung Nguyen
(74) *Attorney, Agent, or Firm* — Locke Lord LLP (57) ABSTRACT

A system and method are provided to perform current sensor error compensation. The system and method involve obtaining a current measurement of a current on a circuit from a current sensor; obtaining a voltage measurement of a voltage associated with the current from a voltage sensor; determining a fundamental frequency of the voltage from the voltage measurement; and performing error compensation on the current measurement based on the determined fundamental frequency to produce a corrected current measurement. The current sensor error compensation may be performed to correct current measurements in a motor system, such as in a motor overload relay, at a low cost by using functionality already available in the system.

19 Claims, 6 Drawing Sheets

Sample Compensation Table for Rogowski Sensor and Integrator

600

| Frequency | Compensation Factor | Frequency | Compensation Factor | Frequency | Compensation Factor | Frequency | Compensation Factor |
|---|---|---|---|---|---|---|---|
| 10 | 2.34 | 30 | 1.27 | 50 | 1.05 | 70 | 0.96 |
| 11 | 2.19 | 31 | 1.25 | 51 | 1.05 | 71 | 0.96 |
| 12 | 2.07 | 32 | 1.23 | 52 | 1.04 | 72 | 0.96 |
| 13 | 1.97 | 33 | 1.22 | 53 | 1.04 | 73 | 0.95 |
| 14 | 1.88 | 34 | 1.20 | 54 | 1.03 | 74 | 0.95 |
| 15 | 1.80 | 35 | 1.19 | 55 | 1.02 | 75 | 0.95 |
| 16 | 1.74 | 36 | 1.18 | 56 | 1.02 | 76 | 0.94 |
| 17 | 1.68 | 37 | 1.17 | 57 | 1.01 | 77 | 0.94 |
| 18 | 1.62 | 38 | 1.15 | 58 | 1.01 | 78 | 0.94 |
| 19 | 1.58 | 39 | 1.14 | 59 | 1.00 | 79 | 0.94 |
| 20 | 1.54 | 40 | 1.13 | 60 | 1.00 | 80 | 0.93 |
| 21 | 1.50 | 41 | 1.12 | 61 | 1.00 | 81 | 0.93 |
| 22 | 1.46 | 42 | 1.11 | 62 | 0.99 | 82 | 0.93 |
| 23 | 1.43 | 43 | 1.11 | 63 | 0.99 | 83 | 0.93 |
| 24 | 1.40 | 44 | 1.10 | 64 | 0.98 | 84 | 0.92 |
| 25 | 1.37 | 45 | 1.09 | 65 | 0.98 | 85 | 0.92 |
| 26 | 1.35 | 46 | 1.08 | 66 | 0.98 | 86 | 0.92 |
| 27 | 1.33 | 47 | 1.07 | 67 | 0.97 | 87 | 0.92 |
| 28 | 1.31 | 48 | 1.07 | 68 | 0.97 | 88 | 0.91 |
| 29 | 1.29 | 49 | 1.06 | 69 | 0.97 | 89 | 0.91 |

FIG. 6

CURRENT SENSOR ERROR COMPENSATION METHOD

FIELD

The present disclosure is related to a method and system to improve an accuracy of current measurements taken by a current sensor, or more specifically, to provide current sensor error compensation for errors influenced by current frequency.

BACKGROUND

Current sensors are widely used in measurement systems for monitoring and protective devices. They are common in industrial protection and load monitoring devices, and are typically used to provide data about load currents. Multiple types of current sensors exist. Two common types of current sensors are, for example, iron core current transformers and air core Rogowski sensors. Each type of current sensor has well understood performance based on design characteristics and physical properties. For both iron core and Rogowski sensors and the circuits and algorithms used to convert their output to usable current measurement data, one variable impacting their measurement accuracy is the frequency of current being measured. Error as a function of frequency can limit the range of application of the current sensors, or impact the design of the sensor or products using the sensor by requiring tighter tolerances or more expensive materials to reduce the error as a function of frequency.

SUMMARY

To address these and other issues, an improved system and method are provided to correct for errors in a current measurement by a current sensor, which result from a current frequency of the current being measured in a circuit. The system and method can apply error compensation to the current measurement of the current sensor as a function of a fundamental frequency (e.g., a load frequency or a power supply frequency). The frequency can be determined by measuring and evaluating a voltage, associated with the measured current, using a voltage sensor.

The improved system and method can provide an approach to achieve accurate current measurement, which avoids the need to minimize the current sensor error as a function of frequency through the design of the sensor, and instead applies compensation for the characterized error based on knowledge of the frequency of current being measured. The system and method can also detect a frequency outside the "compensable" range of current measurement, which can represent an extreme case of current sensor measurement error, and thus, reflect an abnormality in the operation of the monitored device. Furthermore, the current sensor error compensation may be performed to correct current measurements in a motor system, such as in a motor overload relay, at a low cost by using functionality already available in the system.

In accordance with an example embodiment, a system and method are provided to perform current sensor error compensation. The system and method involve obtaining a current measurement of a current on a circuit from a current sensor; obtaining a voltage measurement of a voltage associated with the current from a voltage sensor; determining a fundamental frequency of the voltage from the voltage measurement; and performing error compensation on the current measurement based on the determined fundamental frequency to produce a corrected current measurement. The current sensor error compensation may be performed to correct current measurements in a motor system, and can be implemented, for example, in a motor overload relay which provides circuit protection for the circuit according to at least the corrected current measurement. The current sensor can include an iron core or Rogowski sensors. The voltage sensor can include a capacitor plate to measure the voltage on the circuit using capacitive coupling.

The system and method can perform error compensation by compensating the current measurement as a function of the fundamental frequency of the voltage. The system and method can compensate the current measurement by determining an error compensation factor according to the determined fundamental frequency, and applying the determined error compensation factor to the current measurement to produce the corrected current measurement.

The system and method also can determine the fundamental frequency of the voltage by determining a time period for a voltage waveform associated with the voltage measurement, and determining the fundamental frequency based on the time period. When monitoring a multi-phase circuit such as for a poly-phase motor, the system and method can generate the voltage waveform based on the voltage measurement of two voltage phases from a plurality of voltage phases.

DESCRIPTION OF THE FIGURES

The description of the various example embodiments is explained in conjunction with the appended drawings.

DISCUSSION OF EXAMPLE EMBODIMENTS

Current measurements from a current sensor of a current sensor system may include errors influenced by a frequency of the current that is being measured on a circuit. The errors in the current measurement may contribute to a total error in devices which rely on the current measurement, and may add costs or performance tradeoffs when designing and manufacturing a current sensor system. Accordingly, a system and method for current sensor error compensation are provided, which compensates for error in a current measurement by a current sensor system and its components to counter-act the characterized influence of current frequency (e.g., gain $\alpha$ 1/f for f<cutoff frequency). The system and method can determine a fundamental frequency of the power supply based on a measured voltage associated with the current, and applies error compensation (e.g., compensation or correction) to the current measurement according to the determined fundamental frequency to produce a corrected current measurement. The error compensation can apply a correction factor, such as from a compensation curve or a table of correction factors, to the current measurement. The correction factors can be determined beforehand according to design and manufacture specifications of the sensor system and its components and their frequency response, which may be known (e.g., a Rogowski coil, an integrating analog-digital-converter (ADC), and other current sensor types or components involved in the measurement), or according to empirical data obtained from testing the current sensor system and its components as well as other components associated therewith.

The current sensor error compensation system and method can be implemented using low cost components or in devices, such as an overload relay, which may already incorporate current and voltage sensor systems, thereby providing a low cost approach to reduce current measurement errors influenced by the current frequency. For example, the voltage can be measured using capacitors, such as a capacitive plate for capacitive couplings. The current sensor error compensation system and method also can be used to address current sensor errors at low frequencies. Furthermore, load currents (especially driven from motor drives) can have high harmonics. Thus, it may be more difficult and processing intensive to determine the fundamental frequency from current measurements, than from voltage measurements, for example, using PWM signal.

The frequency detection scheme in the current sensor error compensation system and method can also detect when the frequency is outside a "compensable" range of current measurement, which may represent an extreme case of current sensor measurement error, and thus, abnormalities in the operation of the monitored device. In such an extreme case, the system and method can provide a notification, such as a warning, to personnel or a central management system indicating that the motor system or its components are operating abnormally.

Figure 1:
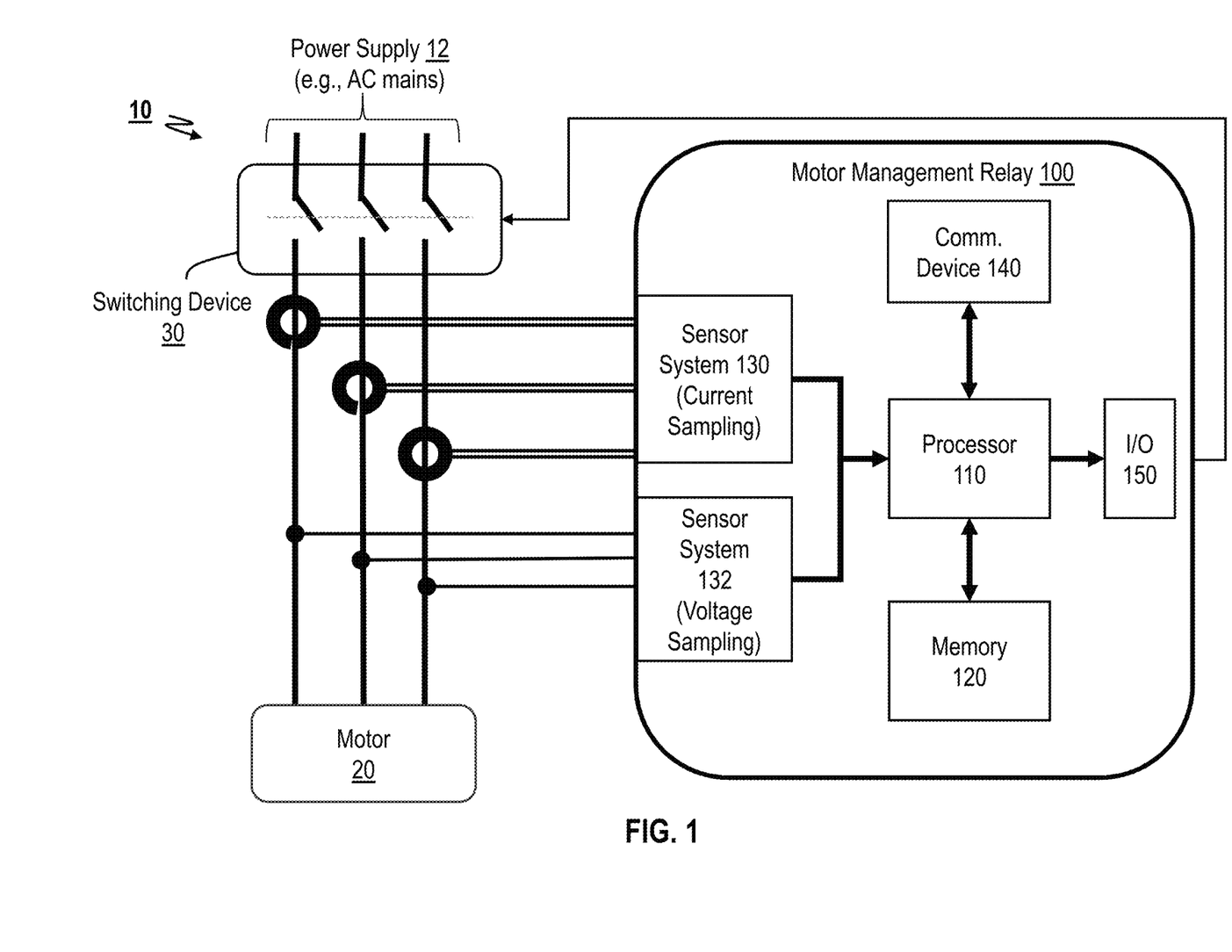
FIG. 1 illustrates a block diagram of an example motor system with a motor, a switching device, current and voltage sensor systems, and a motor management relay with a current sensor error compensator, in accordance with an example embodiment of the present disclosure.

For the purposes of explanation, an example of the current sensor error compensation system and method will be described with reference to an example motor system 10, such as shown in FIG. 1, which employs current and voltage sensor systems to monitor current and voltage in the motor system, and to protect the motor system when the monitored voltage and/or current indicates an abnormal operating condition on the motor system.

As shown in FIG. 1, the motor system 10 includes a motor 20, a switching device 30 to connect or disconnect the motor 20 to or from a power supply 12 (e.g., AC mains) respectively, and a motor management relay 100 to monitor the current and voltage on the motor circuit, to perform current sensor error compensation, and to control the switching device 30 to allow or inhibit power to the motor 20 according to specific or predefined conditions or triggering events. In this example, the motor 20 is an inductance motor or other AC motor. The power supply 12 in this example is a poly-phase power supply, such as a three-phase power supply. The switching device 30 can for example be a circuit interrupter such as a contactor or other circuit interruption mechanism or device to selectively allow or inhibit power flow from the power supply 12 to the motor 20 or components thereof.

The motor management relay 100 (also referred to as the "relay 100") can include a processor(s) 110, memory 120, a current sensor system 130, a voltage sensor system 132, a communication device(s) 140, and input/output (I/O) 150, which are connected across a bus system. The relay 100 can be powered by a battery, or other available power supply system (or power sources). The current sensor system 130 can include one or more current sensors to measure current on the motor circuit. The current sensor can, for example, use iron core current transformer(s) or air core Rogowski coil(s) along with other components such as filter(s) or an integrator(s) (e.g., a digital integrator or integrating analog-to-digital converter (ADC)). The voltage sensor system 132 can include one or more voltage sensors to measure voltage on the motor circuit. The voltage sensor can, for example, use capacitors (e.g., capacitor plates or other capacitive couplings), or resistors such as for high voltage applications. In this example, the motor management relay 100 can be an overload relay for the motor 20, such as for example in a motor starter.

The memory 120 is a data storage device that can store computer executable code or programs, which when executed by the processor 110, controls the operations of the motor management relay 100. The memory 120 can also store error compensation data, such as error compensation factors for a compensation curve or table of compensation factors according to frequency or frequency regions, or an equation reflecting a predetermined relationship between error compensation and frequency. The memory 120 can also store other information (e.g., configuration information, system/device/component parameters and settings, etc.), which is used to control and operate the various components and functions of the relay 100 and the motor system 10.

The communication device(s) 140 can include communication circuitry (e.g., transmitter, receiver, transceiver such as a radio frequency transceiver, etc.) for conducting communications across a network(s) with other remote devices or systems, such as a management control system for a facility (e.g., a computer system with a processor(s), memory, communication device, etc.). For example, the communication device(s) 140 can conduct line-based communications with a remote device via a USB or Ethernet cable interface, or conduct wireless communications with a remote device, such as for example through a wireless personal area network, a wireless local area network, a cellular network or wireless wide area network. The communication device(s) 140 can be used to transmit sensor data associated with the power being supplied to the motor, or other operational data related to the motor 20.

The I/O (Input/Output) 150 includes input and output interfaces to input device(s), and output device(s), respectively. The input devices can include user input devices (e.g., buttons, dials, switches, keyboard or other user input devices) to enable a user to manually set or control operations or other features of the relay 100 and the motor system 10. The output devices can include a display, lights (e.g., LEDs), or other output devices to display information related to the motor 20 or the current sensor system 130, such as the operational status of the motor system, the sensor measurements including the corrected current measurement, the settings for the relay 100, and other operational information related to the status of the motor 20 and components associated therewith. In this example, the processor 110 can also control the switching device 30 or other protection devices, by sending signals or commands to the switching device 30 via the I/O 150.

The processor 110 is configured to control the components and operations of the motor management relay 100. The processor 110 can be a processing system, which can include one or more processors, such as CPU, GPU, controller, dedicated circuitry or other processing unit, which controls the operations of the relay 100, as follows: to obtain and monitor current and voltage in the motor circuit through current measurements from the current sensor system 130 and voltage measurements from the voltage sensor system 132; to determine a fundamental frequency of the voltage associated with the measured current; to perform current sensor error compensation according to the determined fundamental frequency to produce a corrected current measurement; to perform circuit protection using the switching device 30 according to at least the corrected current measurement (e.g., interrupt current/power when the corrected current measurement reflects an abnormal operating condition such as an overload, a fault (e.g., arc fault), and so forth); to output or transmit information relating to the monitored state and other information of the motor 20 including the corrected current measurement, an overload or fault condition, an abnormal operating condition reflected by the determined fundamental frequency, and other operations described herein. The processor 110 can also control the data access and/or storage operations via the memory 120; the input and/or output operations via the I/O 150, communication operations via the communication device 140; and other components of the relay 100 and the motor system 20.

Figure 2:
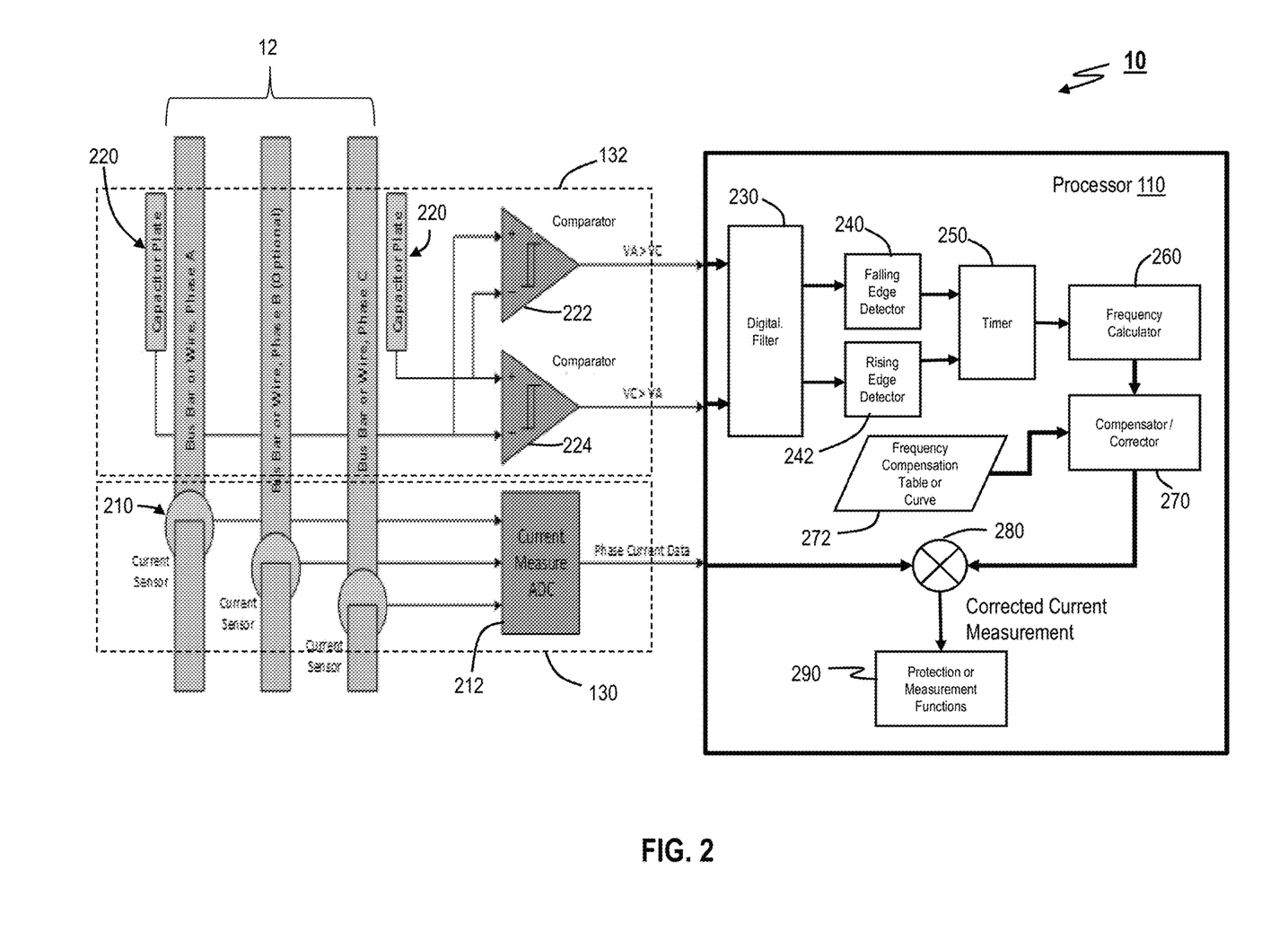
FIG. 2 illustrates a block diagram of various electrical and functional components of an example motor system, such as in FIG. 1, in accordance with an example embodiment of the present disclosure.

FIG. 2 illustrates a block diagram of various example electrical and functional components of some components of the motor system 10 of FIG. 1, in accordance with an example embodiment of the present disclosure. As shown in FIG. 2, the current sensor system 130 includes a plurality of current sensors 210 to measure the current on each phase (e.g., phase A, phase B and Phase C of a bus bar or electrical wire) on the motor circuit, and provide current measurements for each phase. Each current sensor 210 can include a current sensing element, such as iron core current transformers or an air core Rogowski coil, and an integrator such as an integrating analog-to-digital converter (ADC) 212.

The voltage sensor system 132 can include one or more voltage sensors 220. In this example, the voltage sensors 220 can include capacitors, such as capacitive plates 220 which use capacitive coupling to measure the voltage across each of the phases. The voltage sensor system 132 also includes dual-comparators, e.g., comparators 222 and 224, which in this example receive input from only two phases (e.g., phase A and phase C) to produce a voltage measurement, a Pulse Width Modulated (PWM) signal, corresponding to the voltage associated with the measured current.

As further shown in the example of FIG. 2, the processor 110 performs various functions to implement current sensor error compensation. For example, the processor 110 can filter the voltage measurement, e.g., a PWM signal from the voltage sensor system 132, with a digital filter 230, to produce a sinusoidal voltage wave. The processor 110 can determine a falling edge of the voltage waveform with a falling edge detector 240 and a rising edge of the filtered voltage waveform with a rising edge detector 242. The processor 110 can then determine a time period for the waveform (e.g., for a half-cycle period, full-cycle period, etc.) according to the detected rising edge and falling edge of the waveform with the timer 250, and determine a frequency, e.g., a fundamental frequency, of the voltage based on the time period in relations to the waveform (e.g., a half-cycle period or full-cycle period). The processor 110 thereafter can determine an error compensation factor (e.g., inputted from a compensation table or curve 272) according to the determined fundamental frequency with a compensator/corrector 270, and apply the error compensation, e.g., error compensation factor, to the current measurement via a summing point 280 to produce a corrected current measurement.

The processor 110 can implement protection or measurement functions 290 (or other functions) according to at least the corrected current measurements or to the corrected current measurements along with other information (e.g., voltage measurements, motor settings, etc.). As described herein, these functions can include determining various operating conditions in the motor system 10 (e.g., overload, arc fault, abnormally high frequency, etc.), performing circuit protection functions according to the determined operating conditions (e.g., interrupting current), providing notification locally (via output device) or remotely (via communication device 140) regarding the sensor data, monitored condition, circuit protection operation and other motor operational information, and other information for the motor system 10 and its components.

In this example, determining the fundamental frequency of the measured voltages is done from the measurement of two phases. However, it should be understood that depending on the exact power system topology, multiple phases can be compared to each other, or to a neutral or ground voltage if present. The final selection of which phases are measured to determine frequency depends on the product and application.

Figure 3:
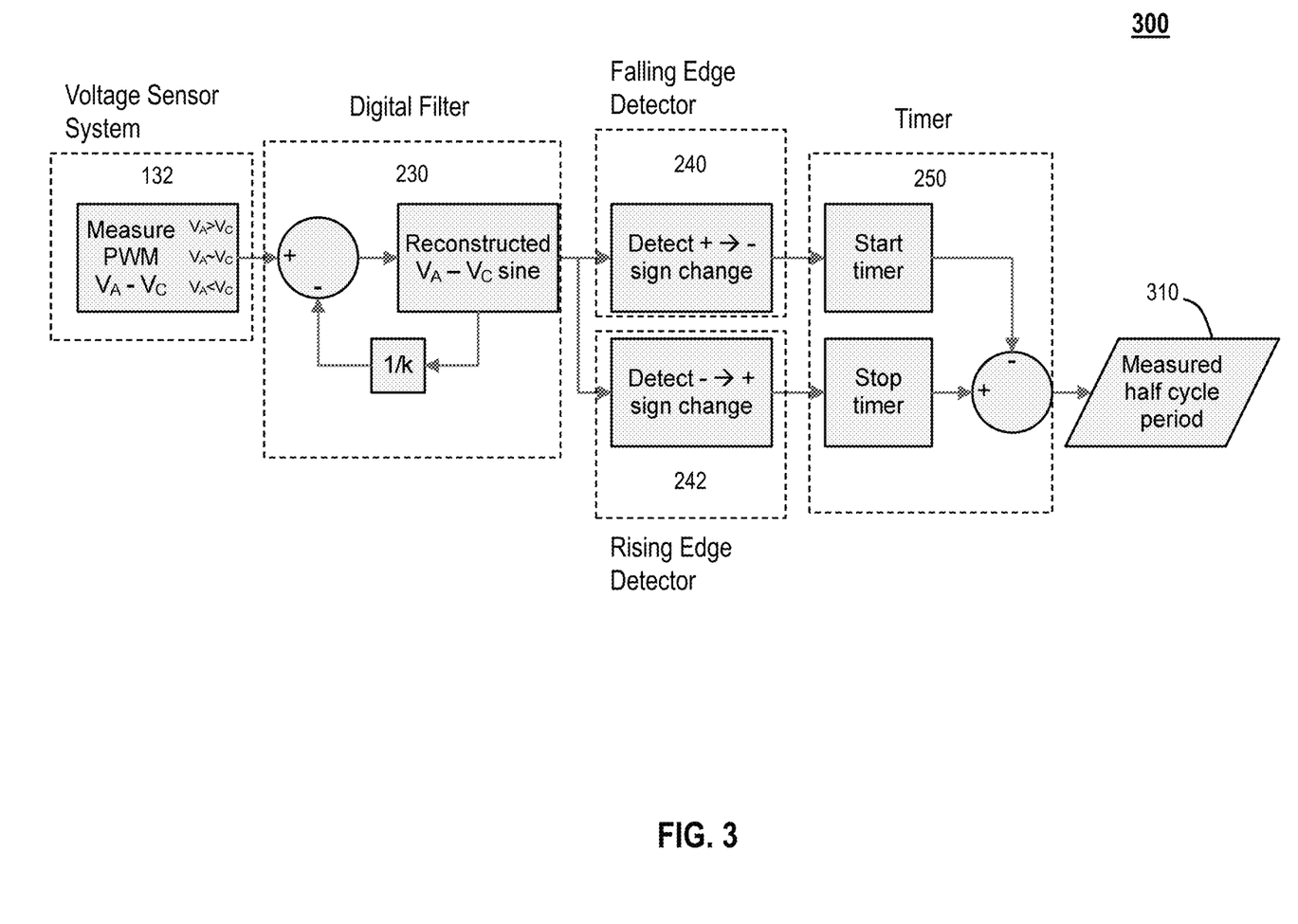
FIG. 3 illustrates a block diagram of example functional components of the current sensor error compensator of the motor management relay, such as in FIG. 1, in accordance with an example embodiment of the present disclosure.

FIG. 3 illustrates a block diagram 300 of example functional components of the current sensor error compensator, such as for example implemented by the processor 110 of the relay 100 in FIG. 1. In this example, the components are configured to measure a half-cycle period for the voltage to determine the fundamental frequency of the voltage associated with the measured current.

As shown in FIG. 3, the voltage sensor system 132 can measure the voltage on phase A, B and C, and produce a PWM signal. The voltage sensor system 132 can for example compare the measured voltage on two phases (e.g., phase A and C) out of the three phases to produce the PWM signal. The digital filter 230 is used to filter the PWM signal from the voltage sensor 132 to reconstruct a voltage waveform, e.g., a sine wave, using a feedback filter configuration. The falling edge detector 240 detects for a change in the voltage waveform from increasing (+) to decreasing (−) to detect a falling edge of the voltage waveform. The rising edge detector 242 detects for a change in the voltage waveform from decreasing (−) to increasing (+) to detect a rising edge of the voltage waveform. The timer 250 can include a counter or the like for measuring a time period. The timer 250 can start when a rising edge is detected in the voltage waveform, and stops when the rising edge is detected. In this example, the timer 250 is configured to determine a time period for a measured half-cycle period of the waveform, which is outputted at reference 310 for use in determining the frequency of the voltage.

The above describes an example implementation to determine a time period for a half-cycle period by measuring the period from a falling edge to a rising edge. The time period can also be measured for a half-cycle period by measuring the time period from a rising edge to a falling edge.

Furthermore, instead of a half-cycle period, a time period for a full-cycle can also be measured to determine the frequency of the voltage.

Figure 4:
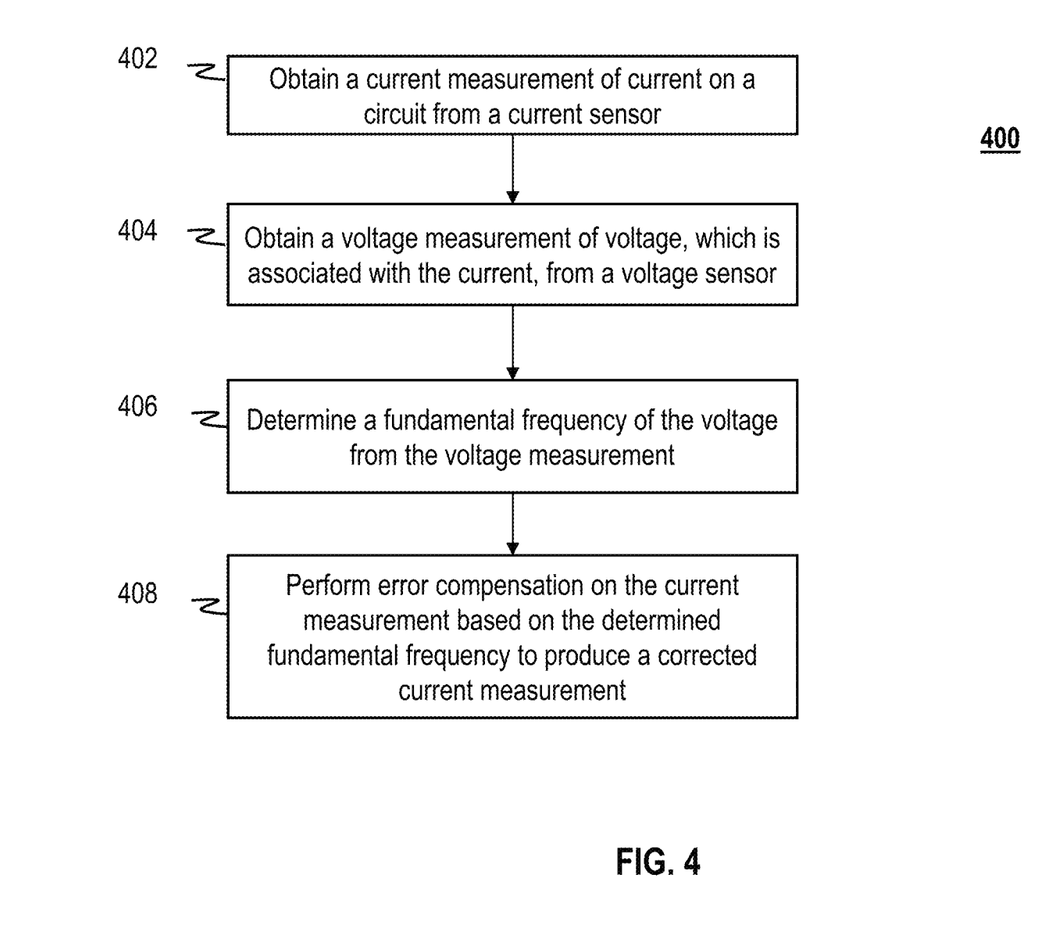
FIG. 4 illustrates an example process by which current sensor error compensation is performed to correct a current measurement from a current sensor system, in accordance with an example embodiment of the present disclosure.

FIG. 4 illustrates an example process 400 by which current sensor error compensation is performed by one or more processors, such as the processor 110 in the relay 100 of FIG. 1.

At reference 402, the processor 110 obtains a current measurement of current on a circuit from a current sensor of the current sensor system 130.

At reference 404, the processor 110 obtains a voltage measurement of a voltage, which is associated with the current, from a voltage sensor of the voltage sensor system 132. The voltage measurement can include measurements from one or more phases depending on the nature of the power supply 12 (e.g., a poly-phase power supply, etc.).

At reference 406, the processor 110 determines a fundamental frequency of the voltage from the voltage measurement. For example, the processor 110 can determine a time period associated with a waveform of the voltage measurement, and determine the fundamental frequency based on the time period (e.g., the frequency varies inversely with a time period for a full-cycle). The time period can be measured, for example, from positive peak-to-negative-peak or negative-peak-to-positive peak for a half-cycle, full-cycle, etc.).

At reference 408, the processor 110 performs error compensation on the current measurement based on the determined fundamental frequency to produce a corrected current measurement. For example, the processor 110 obtains an error compensation factor according to the determined fundamental frequency, e.g., from an error compensation curve or table. The processor 110 then applies the error compensation factor to the current measurement to produce a corrected current measurement. The corrected current measurement can then be used to perform related actions, such as monitoring and reporting operating characteristics and conditions on the circuit (e.g., corrected current measurement, conditions such as overload, fault or abnormal operating frequency, etc.), performing circuit protection operations (e.g., interrupting power on the circuit when an overload or fault is determined according to at least the corrected current measurement).

Figure 5:
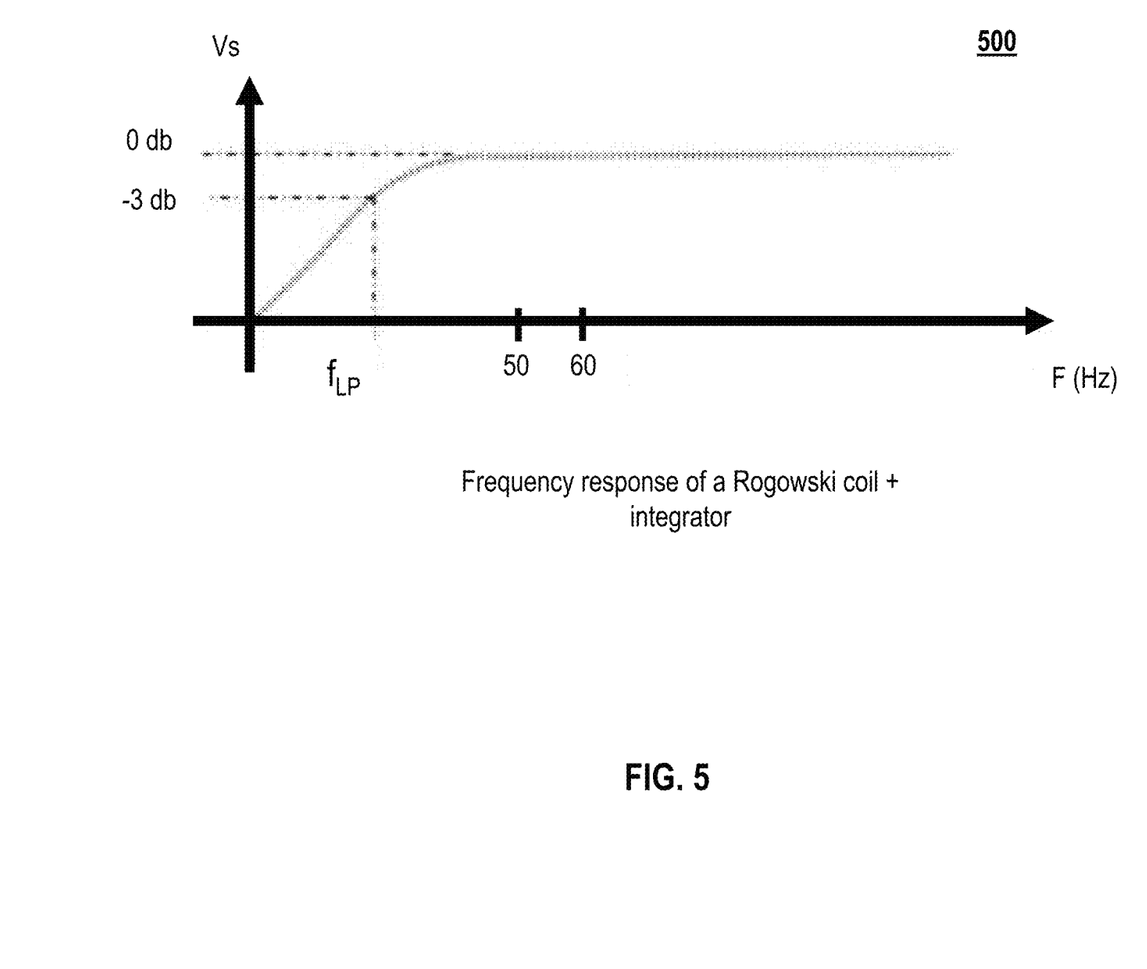
FIG. 5 illustrates a graph illustrating a frequency response of a current sensor with a Rogowski coil and integrator, in accordance with an example embodiment of the present disclosure.
Figure 6:
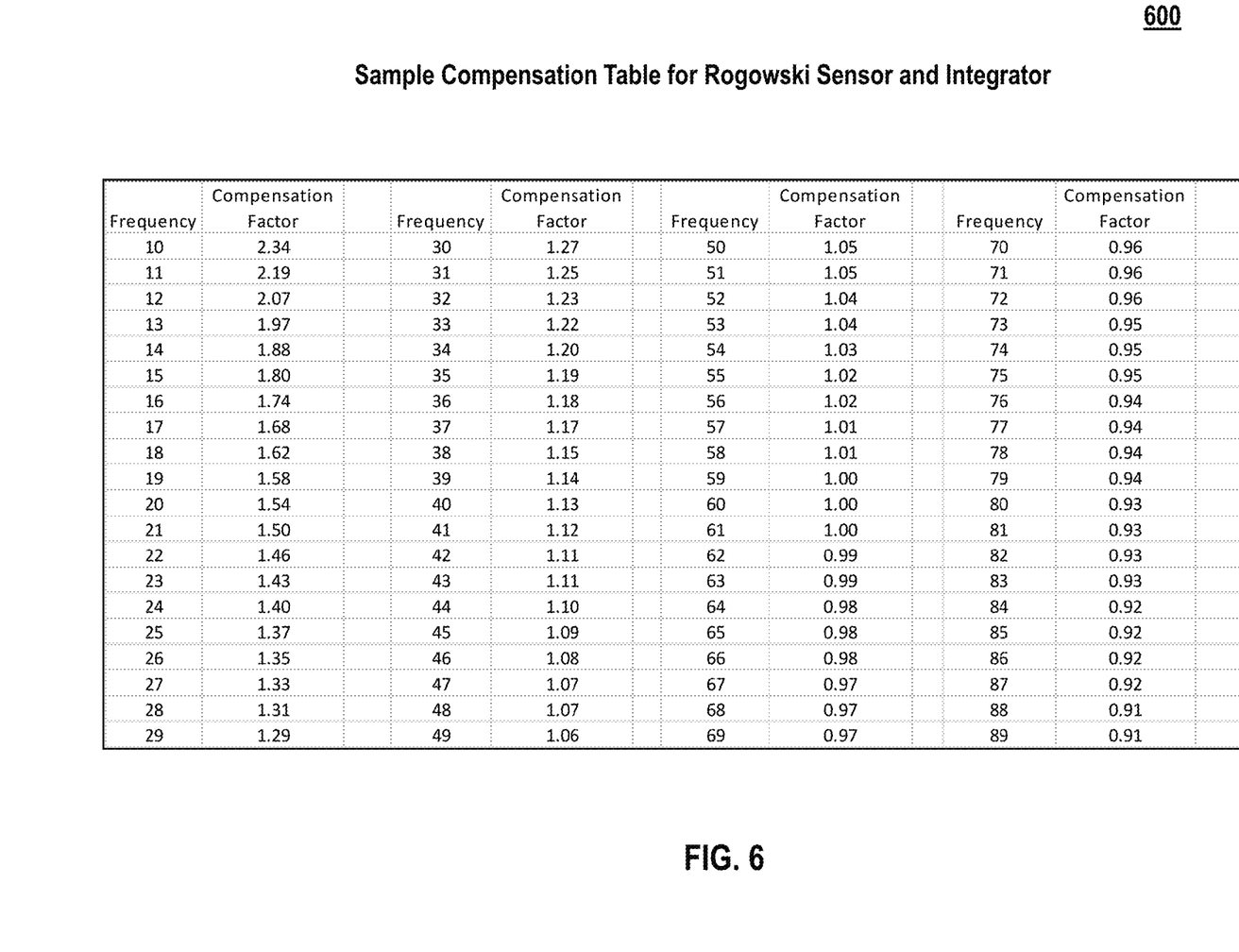
FIG. 6 illustrates an example compensation table for a current sensor with a Rogowski coil and integrator, in accordance with an example embodiment of the present disclosure.

FIG. 5 illustrates a graph 500 illustrating an example frequency response of an example current sensor with a Rogowski coil and an integrator (e.g., a digital integrator). In this example, a low pass filtering ($f_{LP}$) is provided. The frequency response can be used to determine (e.g., calculate) error compensation factors to produce a compensation curve or table of compensation factors as a function of the fundamental frequency. The error compensation factors can be provided in a look-up table or as an equation reflecting error compensation as a function of frequency. For example, following the graph 500 of FIG. 5 showing error as a function of frequency, a gain proportional to 1/(frequency) may be applied below a characterized cutoff frequency, with the scalar value of the gain determined by characterization. An example of a sample error compensation table 600 for an example current sensor with a Rogowski coil and integrator is provided in FIG. 6. As shown in FIG. 6, the table 600 shows different correction factors for different fundamental frequencies.

It should be understood that the current sensor error correction implementations described herein are provided as examples, and can be implemented in systems other than motor systems, which monitor for current and voltage. The error compensation factors can be modeled and stored beforehand for different frequencies or frequency ranges/regions, based on empirical data from testing the current sensor system and its components to ascertain the frequency response thereof, or based on known frequency response of the current sensor system and its components (e.g., Rogowski coil, digital integrator, etc.). For example, characterization of the influence of current frequency on current sensor measurement error can be achieved through test during the design phase of the current sensor or product using the current sensor, or by a test with the product installed in the application. While the characterization can include the properties of the current sensor itself (e.g., the current sensor core and windings), it can also include the acquisition system in the product which measures the current, including analog filtering or digital filtering of the measured output of the current sensor.

Furthermore, the current sensor error compensation system and method can be implemented in an industrial monitoring or protection device, such as a circuit breaker or motor overload relay, which uses iron core current transformers or air core Rogowski type current sensors. In an example embodiment, the system and method can measure current from a variable frequency power source, such as a variable frequency drive. Thus, current can be measured at frequencies which, rather than being contained to a nominal window of tolerance around a single fundamental frequency (e.g., 50 Hz or 60 Hz in the majority of industrial applications) may vary within a wide nominal range, for example from 10 Hz to 100 Hz, because of the use of a variable frequency power supply. However, it should be understood that the current sensor error compensation system and method can be used in any device which uses such current sensors.

It should also be understood that the example embodiments disclosed and taught herein are susceptible to numerous and various modifications and alternative forms. Thus, the use of a singular term, such as, but not limited to, "a" and the like, is not intended as limiting of the number of items.

It will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

Using the description provided herein, the example embodiments may be implemented as a machine, process, or article of manufacture by using standard programming and/or engineering techniques to produce programming software, firmware, hardware or any combination thereof.

Any resulting program(s), having computer-readable program code, may be embodied on one or more computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable medium or in any transmitting medium which transmits such a program.

As indicated above, memory/storage devices can include, but are not limited to, disks, solid state drives, optical disks, removable memory devices such as smart cards, SIMs, WIMs, semiconductor memories such as RAM, ROM, PROMS, etc. Transmitting mediums include, but are not limited to, transmissions via wireless communication networks (e.g., Radio Frequency (RF) communication, the Internet, intranets, telephone/modem-based network communication, hard-wired/cabled communication network, satellite communication, and other stationary or mobile network systems/communication links.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention as defined in the appended claims.

The invention claimed is:

1. A computer-implemented method of performing current sensor error compensation, the method comprising:
   obtaining a current measurement of a current on a circuit from a current sensor;
   obtaining a voltage measurement of a voltage associated with the current from a voltage sensor;
   determining a fundamental frequency of the voltage from the voltage measurement; and
   performing error compensation on the current measurement, comprising: determining a compensation factor based on the determined fundamental frequency, and applying the compensation factor to the current measurement to produce a corrected current measurement.

2. The computer-implemented method of claim 1, wherein the determining operation comprises:
   determining a time period for a voltage waveform associated with the voltage measurement; and
   determining the fundamental frequency based on the time period.

3. The computer-implemented method of claim 2, wherein the circuit is supplied by a poly-phase power supply, the method further comprising:
   generating the voltage waveform based on the voltage measurement of only two voltage phases from a plurality of voltage phases.

4. The computer-implemented method of claim 1, wherein the voltage sensor comprises a capacitor plate to measure the voltage on the circuit using capacitive coupling.

5. The computer-implemented method of claim 1, further comprising:
   digitally integrating an output from the current sensor with a digital integrator to produce the current measurement.

6. The computer-implemented method of claim 1, further comprising:
   controlling circuit protection for the circuit according to the corrected current measurement.

7. The computer-implemented method of claim 1, wherein the circuit is a motor circuit to supply power to a motor.

8. The computer-implemented method of claim 1, wherein the corrected current measurement is produced by summing the current measurement and the compensation factor.

9. The computer-implemented method of claim 1, wherein the determining a compensation factor operation determines the compensation factor by using a look-up table of compensation factors corresponding to a plurality of frequencies or an equation reflecting error compensation as a function of frequency.

10. A system for performing current sensor error compensation comprising:
    a memory; and
    a processor configured:
       to obtain a current measurement of a current on a circuit from a current sensor,
       to obtain a voltage measurement of a voltage associated with the current from a voltage sensor,
       to determine a fundamental frequency of the voltage from the voltage measurement, and
       to perform error compensation on the current measurement, by determining a compensation factor based on the determined fundamental frequency, and applying the compensation factor to the current measurement to produce a corrected current measurement.

11. The system of claim 10, wherein, to determine a fundamental frequency, the processor is configured:
    to determine a time period for a voltage waveform associated with the voltage measurement; and
    to determine the fundamental frequency based on the time period.

12. The system of claim 11, wherein the circuit is supplied by a poly-phase power supply, the processor is further configured:
    to generate the voltage waveform based on the voltage measurement of only two voltage phases from a plurality of voltage phases.

13. The system of claim 10, wherein the voltage sensor comprises a capacitor plate to measure the voltage on the circuit using capacitive coupling.

14. The system of claim 10, wherein the processor is further configured to digitally integrate an output from the current sensor to produce the current measurement.

15. The system of claim 10, wherein the processor is further configured to control circuit protection for the circuit according to the corrected current measurement.

16. The system of claim 10, wherein the circuit is a motor circuit to supply power to a motor.

17. The system of claim 10, wherein the corrected current measurement is produced by summing the current measurement and the compensation factor.

18. The system of claim 10, wherein the processor is configured to determine the compensation factor by using a look-up table of compensation factors for a plurality of frequencies or an equation reflecting error compensation as a function of frequency.

19. A tangible memory medium storing computer executable code, which when executed by a processor, implements a method of performing current sensor error compensation, the method comprising:
    obtaining a current measurement of a current on a circuit from a current sensor;
    obtaining a voltage measurement of a voltage associated with the current from a voltage sensor;
    determining a fundamental frequency of the voltage from the voltage measurement; and
    performing error compensation on the current measurement, comprising: determining a compensation factor based on the determined fundamental frequency, and applying the compensation factor to the current measurement to produce a corrected current measurement.

* * * * *